US006441884B1

(12) United States Patent
Takahashi et al.

(10) Patent No.: US 6,441,884 B1
(45) Date of Patent: Aug. 27, 2002

(54) PROJECTION EXPOSURE APPARATUS

(75) Inventors: Masato Takahashi, Yokohama; Futoshi Mori, Kawasaki, both of (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/567,000

(22) Filed: May 9, 2000

Related U.S. Application Data

(63) Continuation of application No. PCT/JP98/05075, filed on Nov. 11, 1998.

(30) Foreign Application Priority Data

Nov. 12, 1997 (JP) .............................. 9-310438

(51) Int. Cl.[7] .................. G03B 27/42; G03B 27/58; G03B 27/62
(52) U.S. Cl. .................. 355/53; 355/72; 355/75
(58) Field of Search .................. 355/53, 67, 68, 355/69, 70, 71, 72, 75, 76, 18, 95; 356/399–401

(56) References Cited

U.S. PATENT DOCUMENTS

| 4,549,843 A | * | 10/1985 | Jagussch et al. | 414/416 |
|---|---|---|---|---|
| 4,724,466 A | | 2/1988 | Ogawa et al. | 355/53 |
| 5,379,090 A | * | 1/1995 | Shirashi | 355/67 |
| 5,528,118 A | | 6/1996 | Lee | 318/568.17 |
| 5,559,584 A | * | 9/1996 | Miyaji et al. | 355/73 |
| 5,610,683 A | * | 3/1997 | Takahashi | 355/53 |
| 5,610,686 A | * | 3/1997 | Osanai | 355/72 |
| 5,633,720 A | * | 5/1997 | Takahashi | 356/401 |
| 5,767,948 A | * | 6/1998 | Loopstra et al. | 355/53 |
| 5,815,246 A | | 9/1998 | Sperling et al. | 355/53 |
| 5,821,470 A | * | 10/1998 | Miyai et al. | 355/72 |
| 5,844,664 A | * | 12/1998 | Van Kimmenade et al. | 355/53 |
| 5,844,666 A | | 12/1998 | Van Engelen et al. | 355/72 |
| 5,877,843 A | * | 3/1999 | Takagi et al. | 355/30 |
| 5,917,580 A | * | 6/1999 | Ebinuma et al. | 355/53 |
| 5,933,215 A | * | 8/1999 | Inoue et al. | 355/53 |
| 5,953,105 A | * | 9/1999 | Van Engelen et al. | 355/53 |
| 5,986,743 A | * | 11/1999 | Hanzawa | 355/53 |
| 6,038,013 A | * | 3/2000 | Ohsaki | 355/53 |
| 6,048,655 A | * | 4/2000 | Nakahara | 430/22 |
| 6,069,683 A | * | 5/2000 | Iwamoto | 355/53 |
| 6,175,404 B1 | | 1/2001 | Lee | 355/53 |
| 6,246,204 B1 | * | 6/2001 | Ebihara et al. | 318/649 |

FOREIGN PATENT DOCUMENTS

| GB | A-2-299867 | 10/1996 |
|---|---|---|
| JP | 02309624 A | 12/1990 |
| JP | A-8-111374 | 4/1996 |
| JP | A-293455 | 11/1996 |
| JP | A-8-288198 | 11/1996 |
| JP | A-8-306617 | 11/1996 |
| JP | A-9-289155 | 11/1997 |

* cited by examiner

Primary Examiner—Russell Adams
Assistant Examiner—Hung Henry Nguyen
(74) Attorney, Agent, or Firm—Oliff & Berridge, PLC

(57) ABSTRACT

An optical system for illumination is divided into a first optical system (10A) and a second optical system (10B). The second optical system (10B) is fixed to an exposure apparatus main body (SP). The exposure apparatus main body (SP) is provided to a base frame (41) via hard rubbers (31A and 32B) and piezo actuators (32A and 32B), and isolates vibration from the surface of the floor. The first optical system (10A) is supported separately from the exposure apparatus (SP) via actuators such as air mounts (14A and 14B) and voice coil motors (VCMs) (12A, 12B, 13A, and 13B) etc. A control system (50) compensates for the relative positional deviation between the first optical system (10A) and the second optical system (10B) detected by displacement sensors (26A and 26B) by controlling the position of the first optical system (10A) by driving the above described actuators.

23 Claims, 7 Drawing Sheets

PROJECTION EXPOSURE APPARATUS

This is a Continuation of PCT Application No. PCT/JP98/05075 filed on Nov. 11, 1998. The entire disclosure of the prior application(s) is hereby incorporated by reference herein its entirety.

BACKGROUND OF THE INVENTION

1. Field of the Invention

The present invention relates to a projection exposure apparatus which is used when manufacturing a semiconductor element, a liquid crystal display element, or the like by a photolithographic process.

2. Description of the Related Art

In a photolithographic process for making a semiconductor element or liquid crystal substrate or the like, a projection exposure apparatus is employed to expose a pattern image on an original plate such as a reticle or the like onto a photosensitive substrate such as a wafer or the like. With this projection exposure apparatus, for the reason described below, high accuracy positional adjustment has been necessary between an optical system for illumination and an exposure apparatus main body, in other words between an illumination optical system for illuminating an original plate at a uniform illumination distribution, and an exposure apparatus main body for forming a predetermined circuit pattern on a photosensitive substrate by projecting a pattern provided upon the illuminated original plate onto the photosensitive substrate via a projection optical system. That is, the line width of the circuit pattern formed on the photosensitive substrate is increased or decreased in accordance with the amount of exposure of the pattern image which is formed via the above described projection optical system on the photosensitive substrate. Accordingly, in order to limit wide variation of the line width of the circuit pattern, it is necessary to illuminate the pattern which is provided on the original plate at as even an illumination level as possible, and to keep the unevenness of illumination low. Due to this, the positioning accuracy required between the elements which constitute the illumination optical system has become high.

For the above reason, it is only possible for the various elements of the illumination optical system to be separated at portions with a comparatively low value of positioning required accuracy, and as a result it has been necessary to provide the portions which constitute most of the weight of the illumination optical system and the exposure apparatus main body as one unit. Due to this, it has been necessary to provide a frame in the exposure apparatus main body to support the illumination optical system, and because of this the exposure apparatus main body has become large in size. Further, this has led to weight increase of the exposure apparatus main body.

On the other hand, with the exposure apparatus main body, vibration from the surface of the floor is intercepted by an active vibration prevention system, and further vibration generated when heavy parts such as a wafer stage or the like provided inside the exposure apparatus main body accelerate or decelerate during their movement is also suppressed. The active vibration system comprises air springs (hereinafter termed air mounts) which support the exposure apparatus, voice coil motors (hereinafter termed VCMs) which impart thrusts in predetermined directions to the exposure apparatus main body, acceleration sensors which detect vibrations of the exposure apparatus main body, and a feedback control system for controlling the amounts of air supplied to the air mounts and the thrusts of the VCMs and the like based upon vibrations of the exposure apparatus main body detected by the acceleration sensors, etc. According to the above construction, the active vibration prevention system interrupts the transmission of vibrations from the outside, and suppresses vibrations generated within the exposure apparatus main body.

(The Problem of Load on the Air Mounts)

However, along with the fact that the weight of the exposure apparatus main body is increased as described above, the load on the air mounts also becomes large, and the capacity of the compressed air supply which is ordinarily provided in the workshop in which the projection exposure apparatus is set up has sometimes become insufficient. Further, in the same way, the VCMs are also required to be high thrust ones, and the amount of heat generated when driving the VCMs also increases. This heat generation causes air turbulence, and in some cases the measurement accuracy of interferometers for measurement of the position of the wafer stage etc. has become deteriorated.

(Problem of Vibration Transmission to the Exposure Apparatus Main Body)

Further, in the case that the projection exposure apparatus is a scanning exposure method one, a reticle blind which is provided in the illumination optical system is driven during exposure. In a projection exposure apparatus from which an accuracy on the nanometer level is required it has happened that vibration generated at this time cannot be ignored. This will be explained below.

The reticle blind is a device for preventing non-required light emitted by the illumination light in a range of the original plate outside the pattern portion from impinging upon the photosensitive substrate. And the operations of opening it before the beginning of scanning exposure action and closing it after completion are repeatedly performed. It has happened that during these opening and closing operations, vibration generated from a reticle blind opening and closing drive mechanism which has employed a stepping motor and a ball screw or the like, has exerted an influence upon the accuracy of projection exposure, as will be explained below.

When scanning exposure is being performed, the original plate is moved under a band shaped illumination region formed by the optical system for illumination, in the short direction of the band shaped illumination region. A pattern on the original plate which is illuminated in a band shape is formed is as a band shaped pattern image on the photosensitive substrate by the projection optical system. At this time, by making the photosensitive substrate move in the opposite direction from the movement direction of the original plate, and moreover by making the ratio of the movement speeds of the original plate and of the photographic substrate and the projection ratio of the projection optical system agree, a projection image of the pattern is exposed onto the photographic substrate, as it were like a slit camera.

If during scanning exposure the above described ratio of speeds is not kept constant, distortion is generated in the circuit pattern which is formed upon the photosensitive substrate. In detail, when starting to move both the original plate and the photosensitive substrate they are both accelerated, but exposure is performed after reaching a constant speed. In order to perform this acceleration, it is necessary to start mutually moving the original plate and the photosensitive substrate from portions outside the range of exposure, and at this time the above described reticle blind is kept closed so that unnecessary light should not impinge upon the photosensitive substrate. And the reticle blind is opened just before the arrival of the pattern region of the original plate in the band shaped illumination region which is formed by the optical system for illumination is imminent. Moreover a frame shaped light interception band (so called "chrome") is formed surrounding the pattern region, and, since the width of this frame shaped light interception band is greater than the dimensions of the short side of the band shaped illumination region, a light interception state is maintained by the above described light interception band after the reticle blind has been completely opened. Scanning scanning exposure starts as the arrival of the head portion of the pattern region of the original plate in the band shaped illumination region becomes imminent. The arrival of the end edge portion of the pattern region of the original plate in the band shaped illumination region becomes imminent just before this scanning exposure is completed, and next the arrival of the frame shaped light interception band (the "chrome") becomes imminent, and scanning exposure is finished. After this the reticle blind is closed.

As explained above, the opening and closing operation of the reticle blind is performed directly before and directly after scanning exposure, but it can happen that vibration generated during opening and closing operation of the reticle blind may persist during scanning exposure and may exert an influence upon exposure accuracy. Further, a pump or the like may be provided for gas supply or the like to an excimer laser light source etc., and it may happen that this pump becomes a source of vibration which exerts an influence upon exposure accuracy.

SUMMARY OF THE INVENTION

A first objective of the present invention is to propose a projection exposure apparatus in which the exposure optical system can be separated from the portions for which the required accuracy of positioning is high, and in which by doing this the exposure apparatus main body can be made more compact and can be reduced in weight.

A second objective of the present invention is to propose a projection exposure apparatus in which sources of vibration are separated from the exposure apparatus main body, and with which it is possible to obtain high exposure accuracy.

The first projection exposure apparatus according to the present invention that illuminates an original plate on which a predetermined pattern is formed with light emitted from a source of light for exposure, and projects an image of the pattern onto a subject material for exposure, comprises: an optical system for illumination that conducts light emitted from the light source for exposure to the original plate; a projection optical system that is provided between the original plate and the subject material for exposure and projects the pattern on the original plate onto the subject material for exposure; a main body section that is provided as a separate unit from at least one portion of the optical system for illumination and supports the projection optical system; an original plate stage that holds the original plate and is movable; a drive frame that is movable according to a reaction force generated when the original plate stage moves, in a direction reverse to a movement of the original plate stage; and a positioning drive device that performs driving for positioning so as to keep an amount of relative positional deviation between the at least one portion of the optical system for illumination that is provided as a separate unit from the main body section, and the main body section, within a predetermined value.

In this projection exposure apparatus, the positioning drive device may perform positioning by driving at least one of the at least one portion of the optical system for illumination that is provided as a separate unit from the main body section, and the main body section.

Also, the main body section may comprise a stabilizing device that keeps the main body section in a stable state; and the positioning drive device may perform positioning by driving the at least one portion of the optical system for illumination. In this case, the stabilizing device of the main body section may comprise an active vibration prevention device that actively prevents vibration of the main body section.

Also, the optical system for illumination may further comprise a variable illumination visual field aperture device that can adjust a range of illumination of the original plate by the light source for exposure; and in the optical system for illumination a portion disposed on a light incident surface side of the variable illumination visual field aperture device including the variable illumination visual field aperture device may be provided as a separate unit from the main body section. In this case, the positioning drive device may perform positioning by driving at least one of the at least one portion of the optical system for illumination that is provided as a separate unit from the main body section, and the main body section. Or the main body section may use light whose illumination range has been adjusted by the variable illumination visual field aperture device, and perform scanning exposure between the original plate and the subject material for exposure.

The second projection exposure apparatus according to the present invention that illuminates an original plate on which a predetermined pattern is formed with light emitted from a source of light for exposure, and projects an image of the pattern onto a subject material for exposure, comprises: an illumination optical system that comprises a variable illumination visual field aperture device that can adjust a range of illumination of the original plate by the light source for exposure, and that conducts light emitted from the light source for exposure to the original plate; a projection optical system that is provided between the original plate and the subject material for exposure and projects the pattern on the original plate onto the subject material for exposure; a main body section that is provided as a separate unit from a portion of the optical system for illumination, including the variable illumination visual field aperture device, disposed on the light incident surface side of the variable illumination visual field aperture device, and that supports the projection optical system; a stage that is provided as a separate unit from the main body section and that holds and moves the subject material for exposure.

The third projection exposure apparatus according to the present invention that illuminates an original plate on which a predetermined pattern is formed with light emitted from a source of light for exposure, and projects an image of the pattern onto a subject material for exposure, comprises: a variable illumination visual field aperture device that can adjust a range of illumination of the original plate; an illumination optical system that is provided as a separate unit from the light source for exposure, and that conducts light from the light source for exposure to the original plate; a projection optical system that is provided between the original plate and the subject material for exposure and projects the pattern on the original plate onto the subject material for exposure; and a main body section that is provided as a separate unit from at least a portion of the optical system for illumination, and that supports the projection optical system.

This projection exposure apparatus may further comprise: a positioning drive device that performs driving for positioning so as to keep an amount of relative positional deviation between the at least one portion of the optical system for illumination that is provided as a separate unit from the main body section, and the main body section, within a predetermined value.

The fourth projection exposure apparatus according to the present invention that illuminates an original plate on which a predetermined pattern is formed with light emitted from a source of light for exposure, and projects an image of the pattern onto a subject material for exposure, comprises: an illumination optical system that conducts light emitted from the light source for exposure to the original plate; a main body section that is provided as a separate unit from at least a portion of the optical system for illumination, and that comprises at least one of an original plate stage on which the original plate is loaded and a substrate stage on which the subject material for exposure is loaded; and a frame that is provided as a separate unit from the main body section, and to which reaction force, which is generated when the original plate stage or the substrate stage moves, is transmitted.

In this projection exposure apparatus, the original plate stage or the substrate stage may be driven by a non contact type drive device made up from a movable element and a fixed element, and the movable element may be provided to the original plate stage or the substrate stage while the fixed element is provided to the frame.

The fifth projection exposure apparatus according to the present invention that illuminates an original plate on which a predetermined pattern is formed with light emitted from a source of light for exposure, and projects an image of the pattern onto a subject material for exposure, comprises: a main body section that supports a projection optical system which is provided between the original plate and the subject material for exposure and projects the image of the pattern; an illumination optical system at least a part of which is provided as a separate unit from the source of light for exposure and the main body section and illuminates the original plate; a supply device that is provided as a separate unit from the main body section and the illumination optical system and supplies at least one of the original plate and the subject material for exposure to the projection exposure apparatus.

In the first projection exposure apparatus, the main body section may support the original plate stage to be movable.

The first projection exposure apparatus may further comprise an interferometer that is connected to the main body section and detects a position of the original plate stage.

The second projection exposure apparatus may further comprise a positioning drive device that performs driving for positioning so as to keep an amount of relative positional deviation between the at least one portion of the optical system for illumination that is provided as a separate unit from the main body section, and the main body section, within a predetermined value. In this case, the projection exposure apparatus may further comprise a stage that is provided as a separate unit from the main body section and that holds and moves the subject material for exposure.

The fourth projection exposure apparatus may further comprise an interferometer that is connected to the main body section and detects a position of the original plate stage.

The fourth projection exposure apparatus may further comprise an interferometer that is connected to the main body section and detects a position of the substrate stage.

The fifth projection exposure apparatus may further comprise: a first stage that holds and moves the original plate; and a second stage that holds and moves the subject material for exposure. In this case, at least one of the first stage and the second stage may be hold to be movable.

In the fifth projection exposure apparatus, the source of light for exposure may be an excimer laser light source.

DESCRIPTION OF THE PREFERRED EMBODIMENTS

First Embodiment

Figure 1:
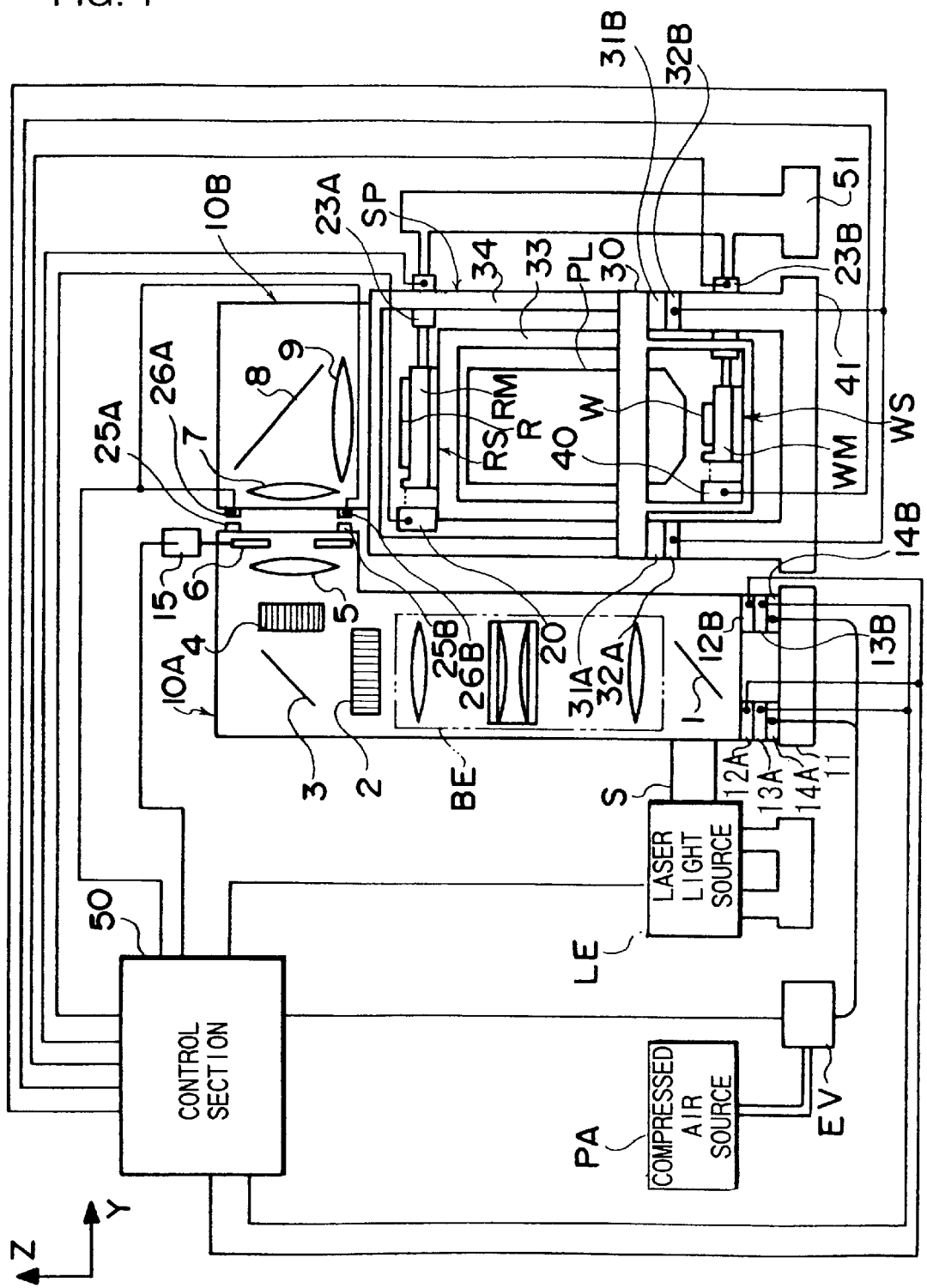
FIG. 1 is a figure showing a simplified construction of a protection exposure apparatus according to a first embodiment.

A projection exposure apparatus according to a first embodiment is now explained with reference to FIG. 1 through FIG. 3. FIG. 1 shows a simplified construction of a projection exposure apparatus according to the first embodiment. The projection exposure apparatus shown in FIG. 1 is a scanning exposure method exposure apparatus which exposes a pattern on an original plate onto a photosensitive substrate while synchronously moving the original plate and the photosensitive substrate. Laser light emitted by a laser light source LE is conducted via optical systems 10A and 10B as illumination light to an original plate R (a mask or reticle, hereinafter termed a reticle) which has been mounted upon a reticle moving stage RM of a main body SP of the exposure apparatus. Illumination light which has passed through the reticle R is projected via a projection optical system PL onto a predetermined region of the surface of a photosensitive substrate W (hereinafter termed a wafer) which has been mounted upon a wafer moving stage WM. This projection exposure apparatus will be explained in detail in the following.

As shown in FIG. 1, the projection exposure apparatus according to the first embodiment is composed of a control section 50, a laser light source LE, an optical system 10A, an optical system 10B, an exposure apparatus main body SP, a reaction frame 51, etc. A signal line is connected to the laser light source LE from the control section 50 which controls the overall operation of the projection exposure apparatus. Laser light such as excimer laser light is emitted from the laser light source LE based upon laser light emission commands which are issued from the control section 50 to the laser light source LE. The laser light is incident upon the optical system 10A via a tubular path S which includes a relay lens.

In order to perform optical axis matching and active vibration elimination as described hereinafter, the optical system 10A and the tubular path S are flexibly connected together. Although the exposure apparatus main body is arranged within a clean room, the laser light source LE is arranged outside the clean room, in order efficiently to make practical use of the area available in the clean room, and in order to supply gas for the laser and to supply gas for exciting the laser. Moreover, although the optical system 10A and the optical system 10B can be arranged either inside or outside the clean room, if they are arranged outside the clean room, they should be arranged within a chamber which is sealed to a high degree of tightness, so that the optical path is kept free from extraneous matter.

(Structure of the Optical Systems 10A and 10B)

Internal to the optical system 10A there are provided a mirror 1, a beam shaping optical system BE, a first fly-eye lens 2, a vibration mirror 3, a second fly-eye lens 4, a relay lens 5, a reticle blind 6, etc. Laser light is incident into this optical system 10A which is structured as above, is reflected by the reflecting mirror 1 which is disposed in the optical system 10A, and is shaped by the beam shaping optical system BE into a laser light beam of a predetermined cross sectional form. The laser light beam emitted by the beam shaping optical system BE passes through the first fly-eye lens 2, is reflected by the vibration mirror 3, and passes through the second fly-eye lens 4. The first fly-eye lens 2 and the second fly-eye lens 4 consist of a large number of lens elements bundled together, and a large number of light source images (secondary light sources) corresponding to the number of lens elements which make them up are formed on the emission sides of these lens elements. The laser light emitted by the second fly-eye lens 4 passes through the relay lens 5 and is incident upon the optical system 10B after passing through the reticle blind 6 which regulates its rectangular opening amount, thus acting as a variable illumination visual field aperture (iris). An actuator 15 which is a drive source for the reticle blind 6 is connected to the control section 50. This actuator 15 consists of a stepping motor and ball screw construction or the like, not shown in the figures. The opening and closing of the reticle blind 6 is controlled by the control section 50 via the actuator 15. The reticle blind 6 is for preventing illumination light which illuminates the range of the original plate outside its patterned portion from impinging upon the photosensitive substrate as unnecessary light, and opens and closes in associated operation with scanning exposure operation, as has also been described with reference to the prior art. Moreover, a base frame 11 which supports or drives the optical system 10A by its base portion, air mounts 14A and 14B, Z direction actuators 13A and 13B, a Y direction actuator 12A, and an X direction actuator 12B will be explained in detail below.

A relay lens 7, a mirror 8, and a condenser lens 9 etc. are disposed inside the optical system 10B. Laser light which is incident upon the optical system 10B passes through the relay lens 7, is reflected off the mirror 8, and is collected by the condenser lens 9. An illumination region on a reticle R which is disposed inside a main body SP of an exposure apparatus which will be described hereinafter is almost evenly illuminated by the illumination light which is regulated by the opening of the reticle blind 6 as above. The optical system for illumination of the projection exposure apparatus according to the first embodiment is made up of the optical system 10A and the optical system 10B which have been described above.

(Structure of the Exposure Apparatus Main Body SP)

The structure of the exposure apparatus main body SP will now be explained. A projection optical system PL, a first column 33, and a second column 34 are fixedly provided on the upper portion of a main frame 30. A wafer base WS and a laser interferometer 40 for measuring the amount of displacement of the moving stage WM (which is movable) upon the wafer base WS in the XY coordinate plane perpendicular to the drawing paper in FIG. 1 (the X coordinate axis extends in the direction perpendicular to the surface of the paper) are fixedly provided in the lower portion of the main frame 30. A reticle base RS and a laser interferometer 20 for measuring the amount of displacement of the moving stage RM (which is movable) on the reticle base RS in the XY coordinate plane are fixedly provided on the first column 33. The movable stages RM and WM are moved by non-contact type actuators 23A and 23B which may be linear motors or the like. The movable elements of the actuators 23A and 23B are provided on the movable stages RM and WM, while the fixed elements of the actuators 23A and 23B are provided on a reaction frame 51 to be described hereinafter. The actuators 23A and 23B and the laser interferometers 20 and 40 are each connected to the control section 50. The control section 50 controls the driving of the moving stage RM by the actuator 23A based upon the amount of movement of the moving stage RM detected by the interferometer 20. Further, the control section 50 controls the driving of the moving stage WM by the actuator 23B based upon the amount of movement of the moving stage WM detected by the interferometer 40. It will be understood that the actuators 23A and 23B are for moving the movable stages RM and WM along the direction of the Y coordinate axis in the plane described above, while drawings and explanations with regard to the actuators for moving them in the X coordinate axis direction which extends perpendicular to the plane of the paper are curtailed, in order to avoid increasing the complexity of explanation. Further, with regard to the laser interferometers, in the same manner drawings and explanations relating to those for the X coordinate axis direction are curtailed. Moreover, it is not absolutely essential for the wafer base WS and the moving stage WM to be provided on the main frame 30, it would also be acceptable to provide them on an frame vibrationally independent of the main frame 30. By doing this it is possible to shorten the manufacturing time for the exposure apparatus, since it is possible to assemble and adjust the projection optical system PL and the moving stage WM independently (by unit or modular construction). In the same manner, it is possible to obtain the same beneficial effect by providing the reticle base RS and the moving stage RM on an frame vibrationally independent of the main frame 30. Further, it would also be acceptable for the movable stages RM and WM and the projection optical system PL each to be independently supported.

The previously described optical system 10B is fixed upon the second column 34. The main frame 30 is supported by the four corners of a base frame 41 which is provided on the floor. Hard rubbers 31A through 31D (however, 31C and 31D are not shown in the figures) and piezo actuators 32A through 32D (however, 32C and 32D are not shown in the figures) are interposed between the support portions of the base frame 41 and the supported portions of the main frame 30. Transmission of vibration from the surface of the floor to the main frame 30 is prevented by these hard rubbers 31A through 31D and piezo actuators 32A through 32D. The details of the hard rubbers 31A through 31D and piezo actuators 32A through 32D will be described hereinafter. With the exposure apparatus main body SP structured as above, an image of a circuit pattern on the reticle R which is mounted on the moving stage RM for the reticle is formed by the projection optical system PL on the wafer W which is mounted on the moving stage WM for the wafer. And a resist applied on the wafer W has been exposed to light, so that the circuit pattern image is transferred to and photographed onto a predetermined region on the wafer W.

(The Reaction Frame 51)

The reaction frame 51 which is placed standing on the floor in the vicinity of a side portion of the main body SP of the exposure apparatus will now be explained. During scanning exposure operation, the movable stages RM and WM are driven by the actuators 23A and 23B as described above, and repeatedly accelerate and decelerate. At this time, the reaction forces acting on the actuators 23A and 23B from the movable stages RM and WM are transmitted to the reaction frame 51. The moving stage RM is floatingly mounted on the reticle base RS by air bearings. The moving stage WM is floatingly mounted on the wafer base WS in the same manner. Accordingly the main frame 30 does not shake, since the reaction forces generated when the movable stages RM and WM accelerate or decelerate are transmitted to the reaction frame 51 but not to the main frame 30. Furthermore vibrations from the floor are not transmitted to the moving stages RM and WM via the reaction frame 51, since the actuators 23A and 23B are non-contact type linear motors. The reaction frame 51 is for discharging the reaction forces which the actuators 23A and 23B receive along the Y coordinate axis direction onto the surface of the floor, but drawings and explanation relating to actuators provided for driving the movable stages RM and WM along the X coordinate axis direction, and relating to a reaction frame for discharging the reaction forces which these actuators receive onto the surface of the floor, will be curtailed.

Figure 7:
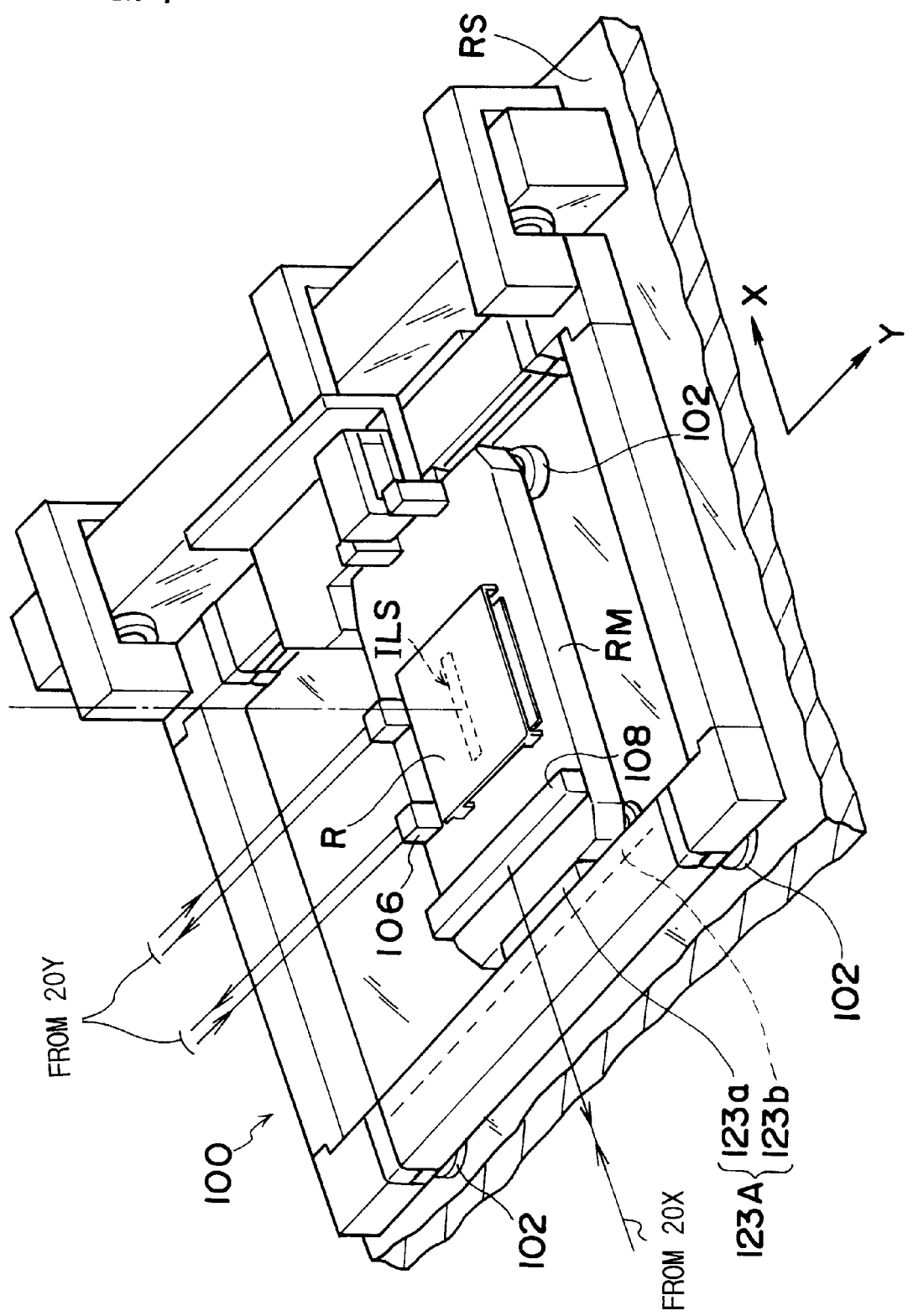
FIG. 7 is a figure showing a moving stage provided with a drive frame.

Further, instead of the reaction frame 51, it would also be acceptable to provide a driven frame moving, with respect to the moving frame RM, in the opposite direction to the movement of the moving stage RM. A moving frame which moves in the opposite direction to the moving stage RM is disclosed in Ser. No. 08/266,999 which was applied for to the U.S. Patent Office on Jun. 27, 1994, and is incorporated as a part of the specification of the present application. FIG. 7 is a figure showing the movable stage RM fitted to a drive frame 100.

A group 123b of magnets (in the interests of simplicity only shown by a dotted line in the figure) which constitutes a fixed element of an actuator 123A is provided on the drive frame 100. A coil 123a which constitutes a movable element of the actuator 123A and operates together with the magnet group 123b is provided on the moving stage RM. The drive frame 100 and the moving stage RM are supported so as to be movable in the Y direction with respect to the reticle base RS by air bearings 102 which are non contact bearings. Further, the law of conservation of momentum operates between the drive frame 100 and the moving stage RM.

Here, if the mass of the moving stage RM is supposed to be ⅕ of the drive frame 100, if the moving stage RM moves 30 cm in the +Y direction, the drive frame 100 moves 6 cm in the −Y direction. Due to this, it is ensured that the reaction force generated when the moving stage RM moves does not exert any bad effect upon exposure, and moreover center of gravity movement due to movement of the moving stage RM ceases to occur.

This drive frame 100 may not be linked, but separate. Further, for positional adjustment of the drive frame, it would also be acceptable to provide an actuator which drives the drive frame 100.

It would also be acceptable to provide this drive frame 100 on the moving stage WM. Further, it would also be acceptable to provide the drive frame 100 on either one of the moving stage RM and the moving stage WM, and to provide a reaction frame on the other one of the moving stage RM and the moving stage WM.

It should be understood that a reflecting member 106, which reflects laser light from the interferometer 20Y which detects the position of the moving stage RM in the Y direction, and a reflecting member 108, which reflects laser light from the interferometer 20X which detects the position of the moving stage RM in the X direction, are provided on the moving stage RM, as shown in FIG. 7. Further, the reticle R is illuminated by a rectangular slit ILS.

The hard rubbers 31A through 31D and the piezo actuators 32A through 32D which are interposed in the connecting portions between the base frame 41 and the main frame 30 will now be explained. The hard rubbers 31A through 31D (in the following referred to as the hard rubbers 31 as long as specific individual explanation is not required) are constructed as elastic members made from hard rubber or the like. And the piezo actuators 32A through 32D (in the following referred to as the piezo actuators 32 as long as specific individual explanation is not required) are connected to the control section 50, and originate displacements along the Z coordinate axis direction in the figures according to the magnitudes of drive signals dispatched from the control section 50. A plurality of vibration sensors (not shown in the figures) are fitted to the main frame 30. These vibration sensors are connected to the control section 50, and input signals to the control section 50 according to vibrations of the main frame 30 which they have detected. Based upon the signals input from the vibration sensors, the control section 50 performs so called active vibration prevention by originating a drive signal for each of the piezo actuators 32A through 32D so as to cancel the vibrations. The hard rubbers 31, in addition to providing the benefit of absorbing mainly the high frequency components when vibration is transmitted from the surface of the floor, also have the beneficial effect of preventing impact forces from acting upon the piezo actuators 32 so as to destroy them, when momentary relative displacement has occurred between the main frame 30 and the base frame 41. These vibration prevention mechanisms composed of the hard rubbers 31 and the piezo actuators 32 are termed "hard mounts". The exposure apparatus main body SP is able always to maintain its steady state, due to the vibration prevention effect of these hard mounts, and due to its construction as described previously which discharges the reaction forces onto the surface of the floor when the movable stages RM and WM accelerate or decelerate.

(Active Vibration Prevention and Positioning Mechanism of the Optical System for Illumination)

An active vibration prevention and positioning mechanism disposed in the optical system 10A for illumination will now be explained with reference to FIG. 2. However only the mechanism for positioning is explained here, while the active vibration prevention mechanism will be explained hereinafter.

(Positioning Mechanism of the Optical System for Illumination)

Figure 2:
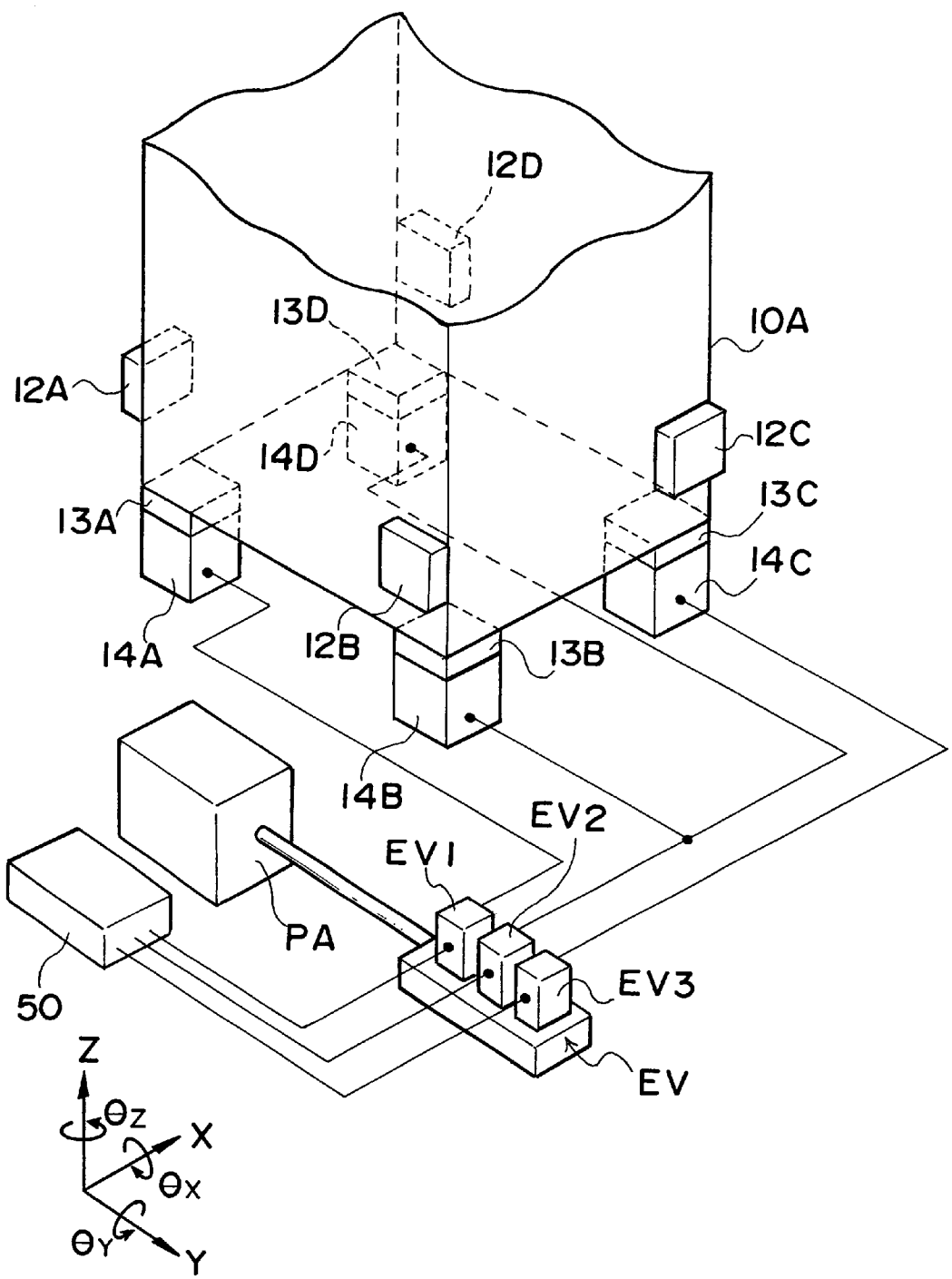
FIG. 2 is a figure showing a construction of an actuator which is disposed in the vicinity of a bottom portion of an optical system for illumination.

FIG. 2 is an enlarged view showing the vicinity of the bottom portion of the optical system 10A. At the four corners of the bottom portion of the optical system 10A there are arranged air mounts 14A through 14D and VCMs 13A through 13D. The optical system 10A is supported by these air mounts 14A through 14D and VCMs 13A through 13D. An electromagnetic valve EV is made up from three electromagnetic valve units EV1, EV2, and EV3 which can operate independently, etc. By pipes, the air mounts 14B and 14D are connected to the electromagnetic valve unit EV2, the air mount 14A is connected to the electromagnetic unit EV1, and the air mount 14C is connected to the electromagnetic unit EV3. The electromagnetic valve EV is connected to a compressed air source PA by a pipe. Further, the electromagnetic valve units EV1 through EV3 and the control section 50 are electrically connected together, and their opening and closing is independently controlled by the control section 50. Due to this, compressed air supplied from the compressed air source PA can be independently provided to the air mounts 14B, and 14D and 14A, and 14C.

The VCMs 13A through 13D are electrically connected to the control section 50, and generate thrusts in the Z coordinate axis direction based upon control signals from the control section 50 (in order to avoid increase in complication of the drawing, the portrayal of the lines in FIG. 2 connecting the control section 50 and the VCMs 13A through 13D is omitted in the drawing). Via the above described air mounts 14A through 14D and VCMs 13A through 13D, the position of the optical system 10A is controlled (its attitude is controlled) by the control section 50 in the Z coordinate axis direction, in the rotational direction (θx) around the X coordinate axis direction, and in the rotational direction (θy) around the Y coordinate axis direction. Moreover, when the positioning described here of the optical system 10A is being performed, with regard to the thrusts which must be generated from the air mounts 14A through 14D and the VCMs 13A through 13D, the thrusts with comparatively long displacement periods are generated by the air mounts 14A through 14D, while the thrusts with comparatively short displacement periods are generated by the VCMs 13A through 13D. By doing this it is ensured that stationary thrusts are not generated by the VCMs 13A through 13D, so that the VCMs 13A through 13D are prevented from heating up.

The VCMs 12A through 12D which are arranged on the side surfaces of the optical system 10A will now be explained while still referring to FIG. 2. The VCMs 12A and 12C are fixed upon the two side surfaces of the optical system 10A which face in the Y coordinate axis direction. The VCMs 12B and 12D are fixed upon the two side surfaces of the optical system 10A which face in the X coordinate axis direction. Furthermore, the VCMs 12A and 12C, and the VCMs 12B and 12D, are arranged in mutually diagonally opposite positions. The respective surfaces of these VCMs 12A through 12D which are opposite to their surfaces which are fixed to the optical system 10A are fixedly provided to fixed members not shown in the figures which are fixedly provided on the base frame 11 (FIG. 1). With the VCMs 12A through 12D being arranged as described above, the optical system 10A can be made to shift in, for example, the +Y direction along the Y coordinate axis by the VCM 12A being caused to generate a repulsive force and the VCM 12C being caused to generate an attractive force, with the absolute values of these forces being kept equal. In the same manner, the optical system 10A can be made to shift in the −Y direction along the Y coordinate axis by causing the VCM 12A to generate an attractive force and causing the VCM 12C to generate a repulsive force. Further, it is possible to make the optical system 10A shift in the±directions along the X coordinate axis in the same manner by causing the VCMs 12B and 12D to generate repulsive force and attractive force. Moreover, it is possible to make the optical system 10A rotate around the Z coordinate axis (θz) by causing both the VCMs 12A and 12C to generate repulsive force, or attractive force. The optical system 10A can also be made to rotate around the Z coordinate axis by the VCMs 12B and 12D.

As described above, the position of the optical system 10A can be determined with six degrees of freedom by the air mounts 14A through 14D, the VCMs 13A through 13D, and the VCMs 12A through 12D. As described hereinafter, the control section 50 controls the above described air mounts 14A through 14D and VCMs 13A through 13D and performs relative positioning between the optical system 10A and the optical system 10B.

(The Displacement Sensors)

Displacement sensors will now be described for detecting the relative displacement of these optical systems 10A and 10B, when the control section 50 is performing the relative positioning of the optical system 10A and the optical system 10B. As shown in FIG. 1, displacement sensors 26A and 26B are fixedly provided on the face of the optical system 10B which faces the optical system 10A. On the other hand, sensor blocks 25A and 25B are fixedly provided on the optical system 10A so as to face the displacement sensors 26A and 26B respectively. Eddy current displacement sensors or capacitance sensors or semiconductor position detection devices (PSDs) or the like may be used as the displacement sensors 26A and 26B. Signals proportional to the distances between the sensor blocks 25A and 25B and the displacement sensors 26A and 26B are output from the displacement sensors 26A and 26B. The sensor blocks 25A and 25B are blocks which serve as references when the above described displacement sensors 26A and 26B are detecting displacement between the optical system 10A and the optical system 10B.

The above described sensor blocks 25A and 25B and displacement sensors 26A and 26B will now be described with reference to FIG. 3. Although only the sensor block 25A and the displacement sensor 26A are shown in FIG. 3, it should be understood that illustration and explanation of the sensor block 25B and the displacement sensor 26B have been curtailed, since the sensor block 25A and the sensor block 25B, and the displacement sensor 26A and the displacement sensor 26B, are of the same structure.

Figure 3:
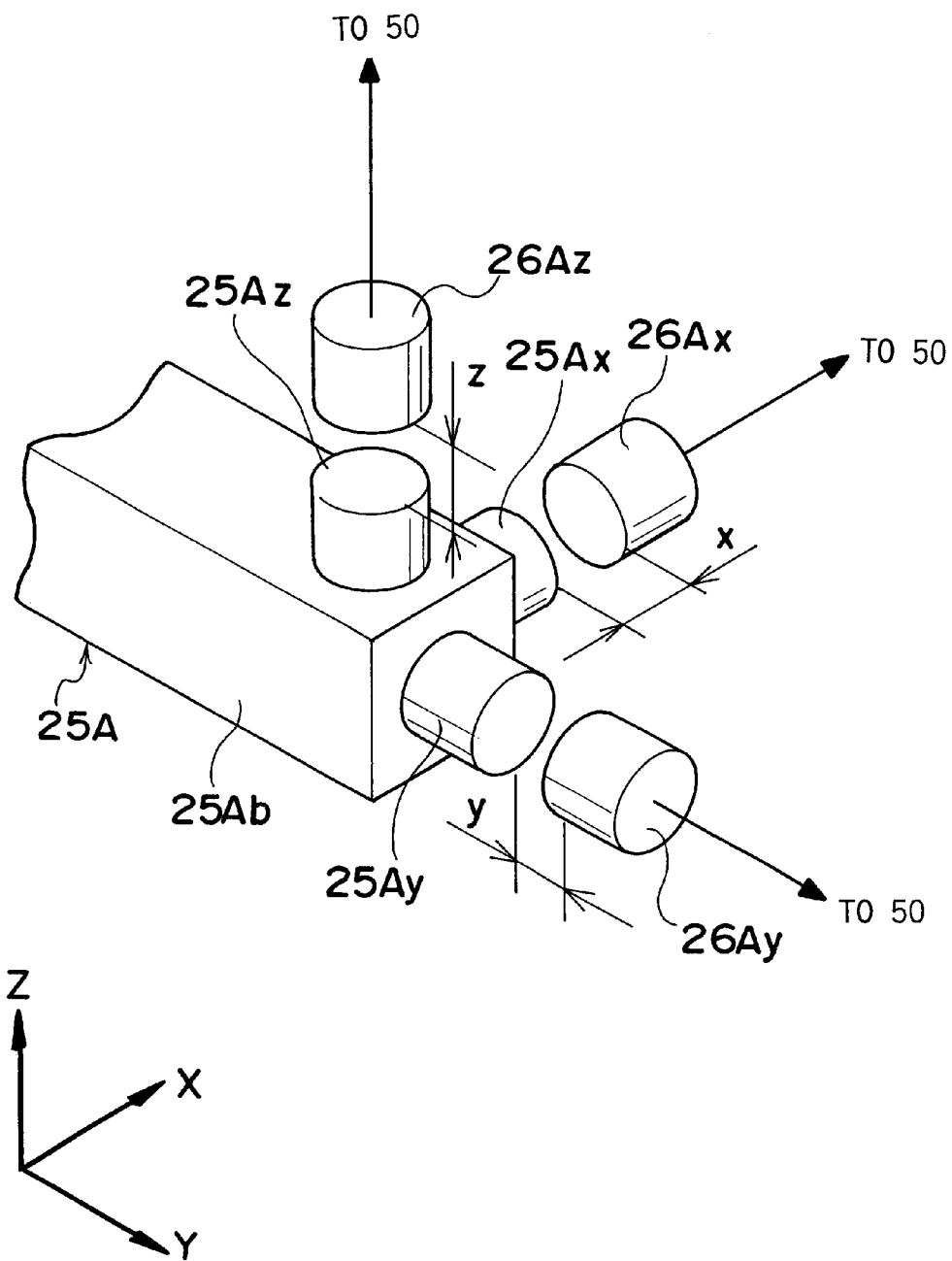
FIG. 3 is a figure showing an exemplary construction of a displacement sensor and of a sensor block which is disposed opposing it.

The displacement sensor 26A in FIG. 3 is made up from an X sensor 26Ax which detects relative displacement to the sensor block 25A in the X coordinate axis direction, a Y sensor 26Ay which detects relative displacement in the Y coordinate axis direction, a Z sensor 26Az which detects relative displacement in the Z coordinate axis direction, and members (not shown in the figure) for keeping these X sensor 26Ax, Y sensor 26Ay, and Z sensor 26Az together as one body, etc. These X sensor 26Ax, Y sensor 26Ay, and Z sensor 26Az are each connected to the control section 50 (FIG. 1). Signals based upon the relative displacements in three dimensions between the displacement sensor 26A and the sensor block 25A detected by these sensors 26Ax through 26Az are input to the control section 50.

The sensor block 25A is made up from an X block 25Ax, a Y block 25Ay, a Z block 25Az, and a base 25Ab. The X block 25Ax, the Y block 25Ay, and the Z block 25Az are fixed to the base 25Ab so as, respectively, to face the X sensor 26Ax, the Y sensor 26Ay, and the Z sensor 26Az.

Figure 4:
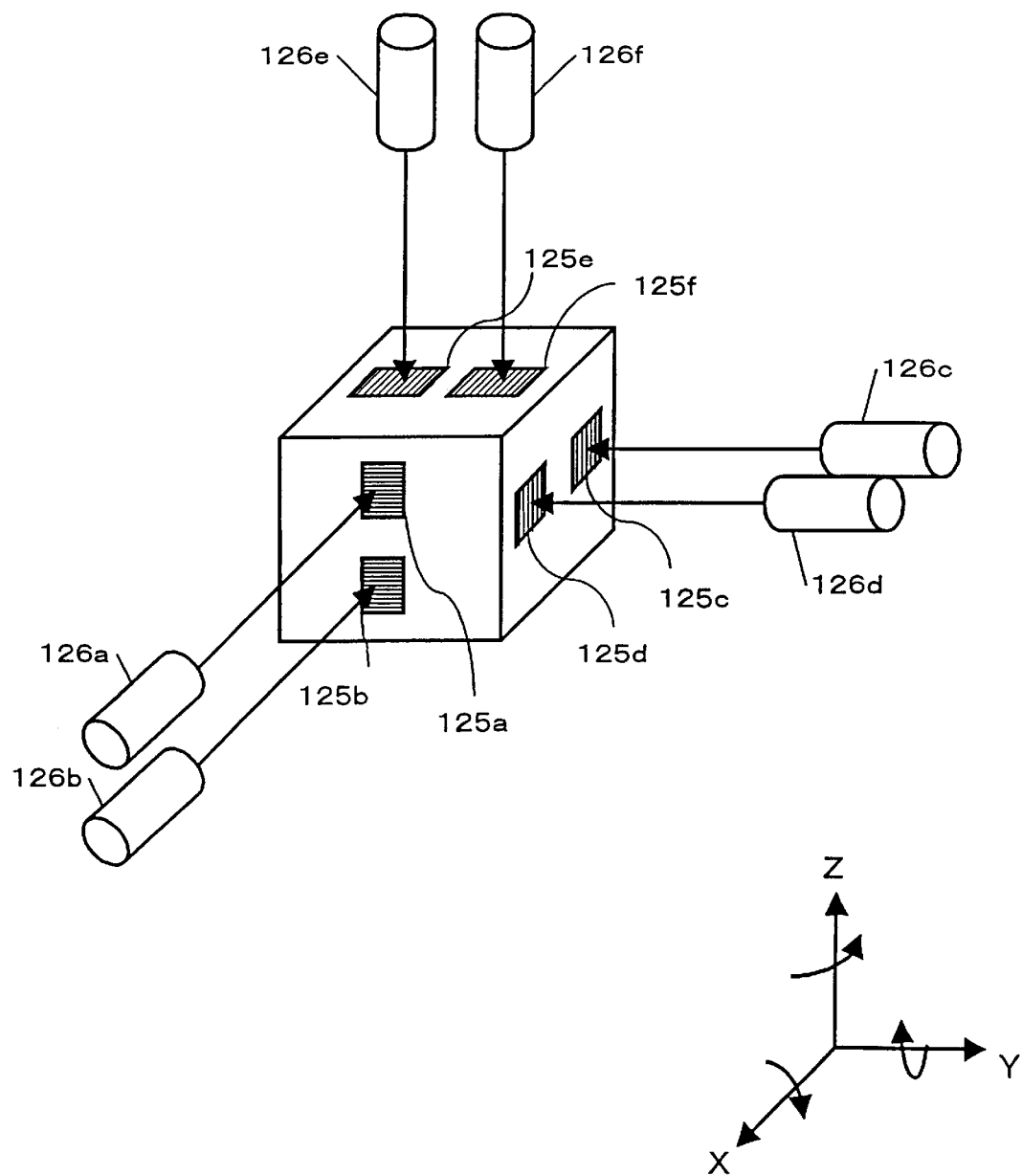
FIG. 4 is a figure showing another exemplary construction of the displacement sensor.

Another exemplary construction for the displacement sensor which has been explained with reference to FIG. 3 will now be explained with reference to FIG. 4. The displacement sensor of FIG. 4 is an optical type linear encoder which is composed of an optical type linear sensor 126 which emits (for example) laser light and receives the reflected light, and a scale 125 which reflects the laser light which has been emitted from the optical type linear sensor 126. The linear optical sensor 126 is made up of 6 individual sensors 126a through 126f. The scale 125 is also made up of 6 individual scales 125a through 125f. The sensors 126a and 126b emit laser light in parallel to the X axis, and are arranged so as to cause the emitted ray bundles to be incident upon the scales 125a and 125b which are provided in a plane parallel to the YZ plane. Further, the sensors 126c and 126d emit laser ray bundles in parallel to the Y axis, and are arranged so as to cause the emitted ray bundles to be incident upon the scales 125c and 125d which are provided in a plane parallel to the XZ plane. Moreover, the sensors 126e and 126f emit laser light in parallel to the Z axis, and are arranged so as to cause the emitted ray bundles to be incident upon the scales 125e and 125f which are provided in a plane parallel to the XY plane.

By the displacement sensor structured in this manner, for example, it is possible to measure displacement in the Z direction by the sensors 126a and 126b, to measure X direction displacement by the sensors 126c and 126d, and to measure Y direction displacement by the sensors 126e and 126f. Furthermore, rotation around the Y axis is obtained based upon the difference in the measured values of the sensor 126a and the sensor 126b, rotation around the Z axis is obtained based upon the difference in the measured values of the sensor 126c and the sensor 126d, and rotation around the X axis is obtained based upon the difference in the measured values of the sensor 126e and the sensor 126f.

(Optical Axis Matching)

The control section 50 inputs signals determined by the relative displacements detected by the displacement sensor 26A and the displacement sensor 26B described above, and calculates the amounts of relative positional deviation (difference) between the optical system 10A and the optical system 10B in the directions of the six degrees of freedom. And the control section 50 calculates the respective thrusts to be generated by each of the air mounts 14A through 14D, the VCMs 13A through 13D, and the VCMs 12A through 12D (all of which are shown in FIG. 2), based upon the results of calculation of the amounts of relative positional deviation between the optical system 10A and the optical system 10B in the directions of the six degrees of freedom. And the control section 50 emits control signals to these air mounts and VCMs so as to generate the thrusts calculated as described above. By doing this, the amount of relative positional deviation between the optical system 10A and the optical system 10B is maintained within a predetermined value, in other words within a permitted value necessary for keeping optical accuracy of the illumination optical system.

(Active Vibration Prevention for the Optical System for Illumination)

Now the active vibration prevention (active damper) for the optical system for illumination will be explained. As has been explained above, the control section 50 controls the air mounts 14A through 14D, the VCMs 13A through 13D, and the VCMs 12A through 12D (all of which are shown in FIG. 2) based upon the relative displacement between the optical system 10A and the optical system 10B detected by the displacement sensors 26A and 26B.

By doing this, the control section 50 maintains the positional relationship between the optical system 10A and the optical system 10B as fixed. Now, since this optical system 10B is fixedly provided to the exposure apparatus main body SP, maintenance of the positional relationship between the optical system 10A and the optical system 10B as described above means exactly the same thing as maintenance of the positional relationship between the optical system 10A and the exposure apparatus main body SP. On the other hand, as previously described, active vibration prevention for the exposure apparatus main body SP is performed by the hard rubbers 31A through 31D and the piezo actuators 32A through 32D (see FIG. 1; but the hard rubbers 31C and 31D, and the piezo actuators 32C and 32D are not shown in that figure), so that it is always kept in a steady state. In other words, by maintaining the positional relationship between the exposure apparatus main body SP which is kept in a steady state, and the optical system 10A, the optical system 10A is itself kept in a steady state. Due to this, active vibration prevention of the optical system 10A is attained.

As has been explained above, in the projection exposure apparatus according to the first embodiment shown in FIG. 1 with the optical system for illumination which is made up from the optical systems 10A and 10B etc., the optical system 10A, that is to say the portion which includes the reticle blind 6 and is disposed on the light incident surface side of this reticle blind 6, is provided as an element separate from the exposure apparatus main body SP. According to this kind of construction, vibration which is generated when the reticle blind 6 operates along with scanning exposure action is not transmitted to the exposure apparatus main body SP. Accordingly vibration generated when the reticle blind 6 operates does not exert any influence upon the accuracy of the circuit pattern which is formed upon the wafer.

Moreover, it will be acceptable to provide the reticle blind 6 in the optical system 10B, if vibration which is generated when the reticle blind 6 operates does not exerts any bad influence upon exposure or if vibration countermeasures are carried out so that vibration which is generated when the reticle blind 6 operates is not transmitted to the exposure apparatus main body.

Since the parts of the optical system 10A are subjected to optical axis matching and active vibration prevention, it may happen that the position of incidence of the laser light from the laser light source LE may change position by the relationship of the optical system 10A and the mirror 1. However, this change of position is a change of position before incidence upon the beam shaping optical system, and does not exert any influence upon the accuracy of the circuit pattern projected or photographed onto the wafer W.

Further, what is fixed upon the upper portion of the second column 34 is only the optical system 10B which is one part of the optical system for illumination, so that the total mass of the exposure apparatus main body SP is lightened. By doing this, it is possible to use the hard mounts, which are made up from the hard rubbers 31 and the piezo actuators 32 and have small maximum permissible load, and this contributes to reduction of cost.

At this time, relative displacement of the optical system 10A and the optical system 10B is detected by the displacement sensors 26A and 26B, and the control section 50 controls the position and the attitude of the optical system 10A based upon the results of this detection. By doing this, the optical axis of the optical system 10A and the optical axis of the optical system 10B are accurately matched. Accordingly, it is possible to separate the illumination optical system into portions that could not be separated in the prior art due to the maintenance of accuracy, and it is possible easily to attain isolation of vibration and reduction of the weight of the exposure apparatus main body, etc.

Transmission of vibration from the floor to the exposure apparatus main body SP is prevented by the above described hard mounts which are composed of the hard rubbers 31 and the piezo actuators 32. Further, in the exposure apparatus main body SP, the reaction forces generated when the moving stages RM and WM accelerate and decelerate are discharged onto the floor via the reaction frame 51. It is possible to keep the exposure apparatus main body SP always in a steady state by this type of construction. On the other hand, it may occur that the above described piezo actuators 32 suffer change over time and are deformed, and that the exposure apparatus main body SP sinks down. Even if sinking down of the exposure apparatus main body SP occurs, the control section 50 can control the position of the optical system 10A along with this sinking down. Due to this, the projection exposure apparatus according to this embodiment can always precisely maintain the accuracy of the illumination optical system.

Moreover, in the above described embodiment, the control system 50 was one which controlled the position of the optical system 10A to match the optical axis of the optical system 10A and the optical axis of the optical system 10B. Instead of this, it is also acceptable to provide the above described hard rubbers 31 and piezo actuators 32 and actuators which exert forces in the X and Y directions with respect to the exposure apparatus main body SP, and to match the optical axis of the optical system 10A and the optical axis of the optical system 10B by controlling the position of the optical system 10B by the control system 50. Furthermore, it would also be acceptable to control the position of the optical system 10A and the position of the optical system 10B individually by the control system 50. In this case, for example, it would be acceptable for the control section 50, when aligning the position of the optical system 10A and the position of the optical system 10B, to perform rough adjustment with the optical system 10B, and to perform fine adjustment with the optical system 10A. By doing this it is possible, along with enhancing the control characteristics of the control system 50, to shorten the time period for alignment of the position of the optical system 10A and the position of the optical system 10B.

Moreover, whatever the reason may be for the optical axis of the laser light source LE having undesirably deviated, the influence of the deviation of the optical axis of the laser light source LE can be eliminated by adjusting the positions of the optical system 10A and the exposure apparatus main body SP using the previously described air mounts 14A through 14D, VCMs 13A through 13D, VCMs 12A through 12D, hard rubbers 31 and piezo actuators 32. Since by doing this it is possible quickly to eliminate the influence of optical axis deviation even in the event that the optical axis of the laser light source LE has deviated, therefore a shortened time period for interruption of exposure action is sufficient and deterioration of throughput can be prevented. It should be understood that while it is acceptable for the positional adjustment of the optical system 10A and the exposure apparatus main body SP using the previously described air mounts 14A through 14D, VCMs 13A through 13D, VCMs 12A through 12D, hard rubbers 31 and piezo actuators 32 to be performed by the control section 50, it may also be performed manually.

Embodiment 2

Figure 5:
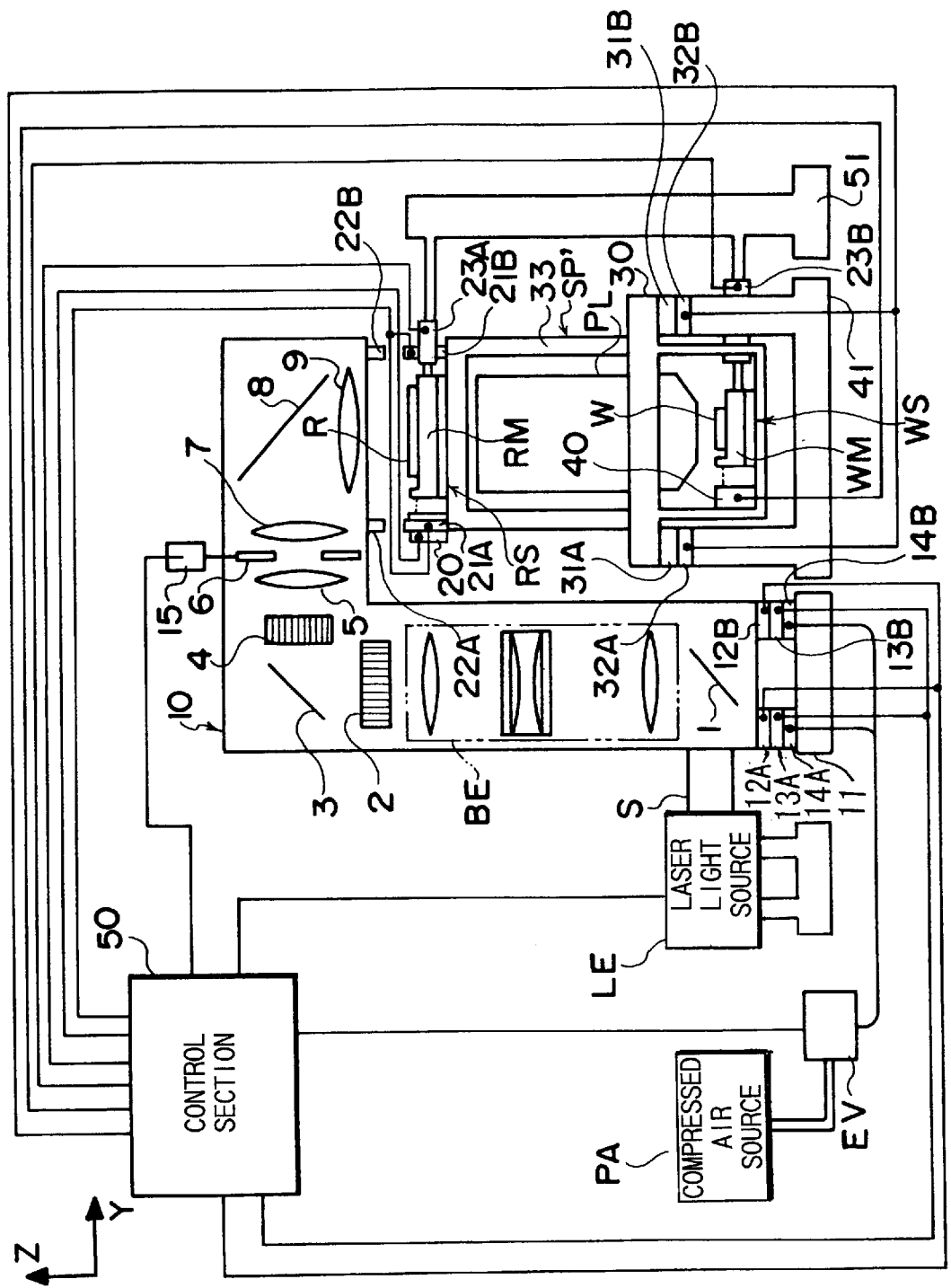
FIG. 5 is a figure showing a simplified construction of a projection exposure apparatus according to a second embodiment.

A projection exposure apparatus according to a second embodiment is now explained with reference to FIG. 5. FIG. 5 shows a simplified construction of a projection exposure apparatus according to the second embodiment. It should be understood that the projection exposure apparatus shown in FIG. 5, like the projection exposure apparatus according to the first embodiment shown in FIG. 1, is also a scanning exposure method exposure apparatus; the same reference symbols will be affixed to identical constructional elements, and explanation thereof will be curtailed, with the explanation concentrating upon the differences from the FIG. 1 apparatus.

Referring to FIG. 5, the optical system 10 is one in which the optical system 10B (FIG. 1) of the projection exposure apparatus according to the first embodiment is constructed as a unit with the optical system 10A, while the optical system 10B (FIG. 1) is constructed as a separate unit from the exposure apparatus main body SP'. Due to this, on the main frame 30, the second column 34 which the projection exposure apparatus shown in FIG. 1 possesses is not provided.

Displacement sensors 21A and 21B are fixedly provided at diagonally opposite corner positions on the upper surface of the first column 33. In the optical system 10, sensor blocks 22A and 22B are fixedly provided opposing the displacement sensors 21A and 21B. The displacement sensors 21A and 21B and the sensor blocks 22A and 22B are of the same construction as the displacement sensors 25A and 25B and the sensor blocks 26A and 26B (FIG. 3) used in the projection exposure apparatus according to the first embodiment. A control section 50 controls the thrusts of air mounts 14A through 14D, VCMs 13A through 13D, and VCMs 12A through 12D based upon the relative displacements in the directions of the six degrees of freedom between the optical system 10 and the exposure apparatus main body SP' detected by the displacement sensors 21A and 21B. By doing this, it is possible to perform matching at high accuracy between the optical axis of the optical system 10 and the optical axis of a projection optical system PL arranged on the exposure apparatus main body SP'.

In the projection exposure apparatus according to the second embodiment as well, vibration generated when the reticle blind 6 operates together with scanning exposure action is not transmitted to the exposure apparatus main body SP'. Further, the exposure apparatus main body SP' and the optical section 10 are constructed as separate units. Accordingly, it is possible further to reduce the size and weight of the exposure apparatus main body SP', in comparison with the projection exposure apparatus according to the first embodiment. By doing this, it is also possible further to reduce the maximum permissible load upon the piezo actuators 32A through 32D (the piezo actuators 32C and 32D are omitted from the drawing) and upon the hard rubbers 31A through 31D (the hard rubbers 31C and 31D are omitted from the drawing) in comparison with those of the projection exposure apparatus according to the first embodiment.

With the second embodiment above, the control section controls the position of the optical system 10 so that the optical axis of the optical system 10 and the optical axis of the photographic system PL matches with each other. Instead of this, it would also be acceptable to provide actuators to the exposure apparatus main body SP' for positioning of the exposure apparatus main body SP', and for the control system 50 to control the position of the exposure apparatus main body SP' by these actuators so that the above described matching is performed.

Although the projection exposure apparatuses according to the first and second embodiments described above were ones which performed matching of the optical axes of optical systems for illumination which were provided separately, or matching of the optical axis of a projection optical system which was provided to the exposure apparatus main body and the optical axis of an illumination optical system which was provided as separated from this exposure apparatus main body, it is also possible to perform relative positional alignment of a loader which will be described hereinafter and the exposure apparatus main body. In the following, this example will be explained with reference to FIG. 6.

Figure 6:
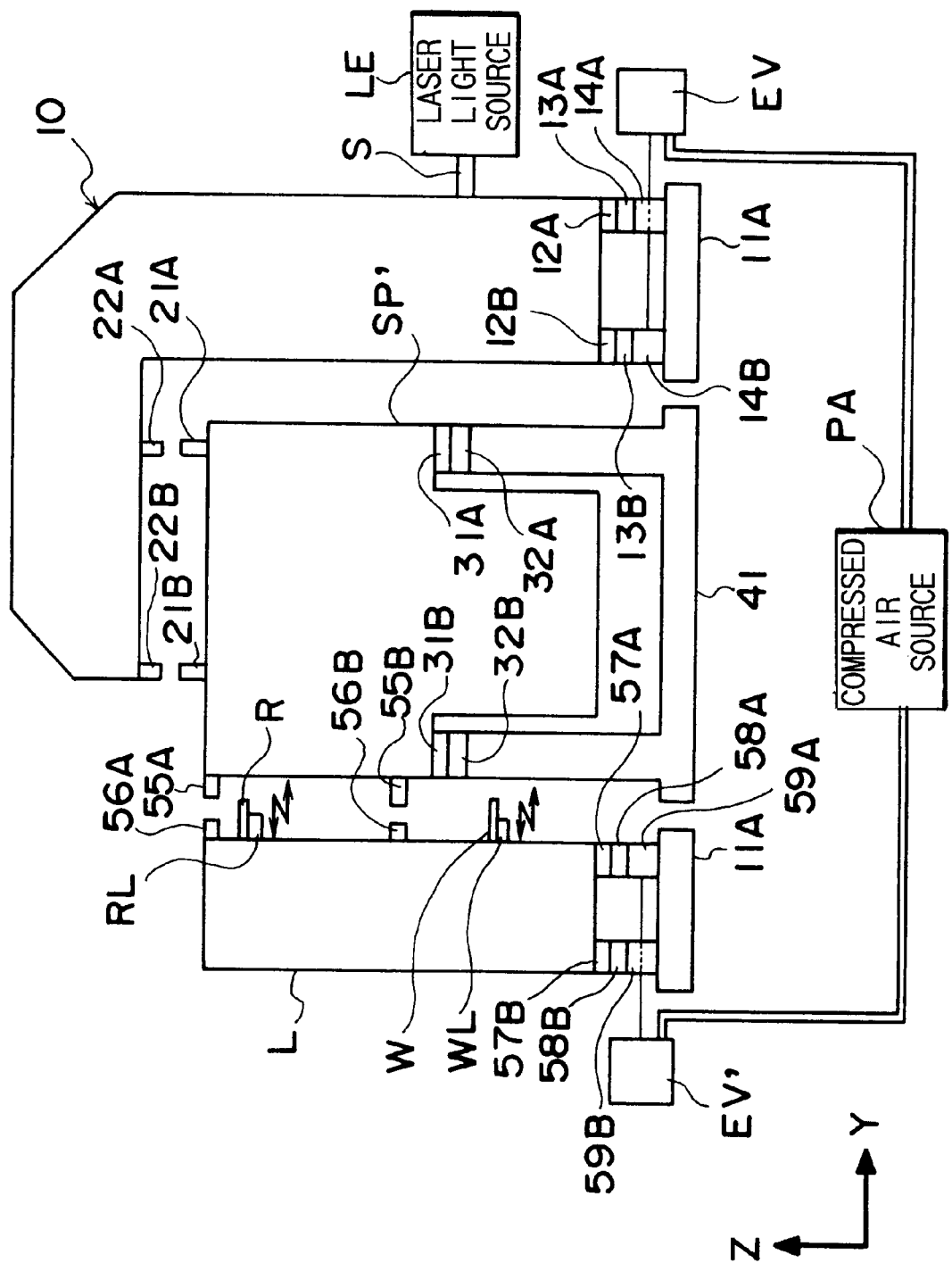
FIG. 6 is a figure showing a simplified construction of a loader which is disposed next to and in contact with the projection exposure apparatus.

FIG. 6 is a simplified figure showing a projection exposure apparatus like that shown in FIG. 5 with a loader L mounted in its vicinity. In FIG. 6, the same reference symbols as in FIG. 5 will be affixed to the same constructional elements, and explanation thereof will be curtailed.

A reticle loader RL and a wafer loader WL are provided in the loader L. The reticle loader RL loads a specified reticle R onto a reticle moving stage RM (FIG. 5) of the exposure apparatus main body, or unloads the reticle R which is loaded upon the reticle moving stage RM. The wafer loader WL loads a non exposed wafer W onto a wafer moving stage WM (FIG. 5), or unloads an exposed wafer W which is loaded upon the wafer moving stage WM.

Displacement sensors 55A and 55B are fixed upon the face of the exposure apparatus main body SP' which opposes the loader L. On the other hand, sensor blocks 56A and 56B are fixed upon the loader L facing the sensors 55A and 55B respectively. The displacement sensors 55A and 55B and the sensor blocks 56A and 56B are of identical constructions to the displacement sensors 21A and 21B and the sensor blocks 22A and 22B described previously, and their detailed explanation will be curtailed.

Air mounts 59A through 59D (59C and 59D are not shown in FIG. 6) and VCMs 58A through 58D (58C and 58D are not shown in FIG. 6) are provided at the four corners of the bottom portion of the loader L, just as with the optical system 10. The VCMs 57A through 57D (57C and 57D are not shown in FIG. 6) are fixedly provided to the side surfaces of the lower portion of the loader L in an identical manner to the manner of arrangement of the VCMs 12A through 12D which has been explained with reference to FIG. 2. The air mounts 59A through 59D are connected to an electromagnetic valve EV', and air from a compressed air source PA is conducted to the air mounts 59A through 59D according to the opening and closing of this electromagnetic valve EV'. The loader L described above is placed upon a base frame 11A along with the optical system 10. This base frame 11A has a quadrilateral frame shaped form which surrounds the periphery of the base frame 41.

Although the linking lines have been omitted from FIG. 6, the above described displacement sensors 55A and 55B, the VCMs 58A through 58D and 57A through 57D, and the electromagnetic valve EV' are connected to the control section 50 (FIG. 5). The control section 50 (FIG. 5) performs relative positioning of the loader L and the exposure apparatus main body SP, in the same manner as has been explained with reference to FIG. 1 and FIG. 5. By doing this, even if sinking down of the exposure apparatus main body SP' has occurred along with the piezo actuators 32A through 32D suffering change over time (32C and 32D are not shown in FIG. 6), the control section 50 can control the position of the loader L in accompaniment with this sinking down. Accordingly, when loading the reticle R onto the reticle moving stage RM (FIG. 5) or the wafer W onto the wafer moving stage WM (FIG. 5), it is possible to maintain loading positional accuracy with high accuracy over a long time period.

Moreover, the exposure apparatus of this embodiment can be manufactured by putting into place the optical system 10A which is made up from a plurality of lenses; by fitting the optical system 10B and the projection optical system PL into the exposure apparatus main body and optically adjusting them; by attaching the reticle base RS, the moving stage RM, the wafer base WS and the moving stage WM, which consist of a large number of mechanical parts, to the exposure apparatus main body and connecting them by lines and/or conduits; and further by performing total adjustment (electrical adjustment, operational checking, etc.). Further, it is desirable for the manufacture of the exposure apparatus to be performed in a clean room in which the temperature and the cleanliness, etc., are controlled.

Although in the above explanation the present invention has been explained, in exemplary terms, with the main body section to which the original plate and/or photosensitive substrate are equipped and a portion of the illumination optical system being provided as separate units in the projection exposure apparatus, or with the main body section and a loader of the original plate and/or photosensitive substrate being provided as separate units, it is not necessary for the present invention to be limited to this content. That is to say, in the projection exposure apparatus, in which the main body section for which vibration and the like need to be suppressed as much as possible and the portions which become sources of generation of vibration and the like are provided as separate units and a predetermined high degree of accuracy of relative positional relationship is required between them, the present invention can be applied to any combinations between them.

Further, although the present invention has been explained with regard to a projection exposure apparatus, it is not necessarily limited thereto. It can be applied to other exposure apparatus as well, such as a charged particle beam exposure apparatus or an X-ray exposure apparatus or the like. In other words, the present invention can also be applied to an exposure apparatus for manufacture of semiconductors or for performing any minute processing, when a relative positional relationship of predetermined high accuracy is required between a main body section and a separate section which includes a source of vibration.

What is claimed is:

1. A projection exposure apparatus that illuminates an original plate on which a predetermined pattern is formed with light emitted from a light source to project an image of the pattern onto an object, comprising:
    an illumination optical system that illuminates the original plate;
    a projection optical system located between the original plate and the object to project the pattern onto the object;
    a main body that is provided as a separate unit from at least part of said illumination optical system and supports said projection optical system;
    an original plate stage that holds the original plate and is movable;
    a drive frame that moves responsive to a reaction force exerted by the movement of the original plate stage in a direction opposite to the direction of movement of the original plate stage; and
    a positioning drive device that performs driving for positioning so as to keep an amount of relative positional deviation between said at least part of said illumination optical system and said main body within a predetermined value.

2. A projection exposure apparatus according to claim 1, wherein said positioning drive device performs positioning by driving at least one of said at least part of said illumination optical system and said main body.

3. A projection exposure apparatus according to claim 1, wherein:
said main body comprises a stabilizing device that keeps said main body in a stable state; and
said positioning drive device performs positioning by driving said at least of said illumination optical system.

4. A projection exposure apparatus according to claim 3, wherein said stabilizing device of said main body comprises an active vibration prevention device that actively prevents vibration of said main body.

5. A projection exposure apparatus according to claim 1, wherein:
said illumination optical system further comprises a variable field aperture device that can adjust an illumination area of the original plate; and
a portion of said illumination optical system is disposed on a light incident surface side of said variable field aperture device such that said portion of said illumination optical system is provided as a separate unit from said main body, said portion of said illumination optical system including said variable field aperture device.

6. A projection exposure apparatus according to claim 5, wherein said positioning drive device performs positioning by driving at least one of said portion of said illumination optical system and said main body.

7. A projection exposure apparatus according to claim 5, wherein said main body uses light whose illumination has been adjusted by said variable field aperture device to perform scanning exposure between the original plate and the object.

8. A projection exposure apparatus according to claim 1, wherein said main body supports said original plate stage to be movable.

9. A projection exposure apparatus according to claim 1, further comprising an interferometer that is connected to said main body and detects a position of the original plate stage.

10. A projection exposure apparatus that illuminates an original plate on which a predetermined pattern is formed with light emitted from a radiation source to project an image of the pattern onto an object, comprising:
an illumination optical system having said radiation source and a variable field aperture device that can adjust an illumination area of the original plate to illuminate the original plate;
a projection optical system located between the original plate and the object to project the pattern onto the object;
a main body that is provided as a separate unit from a portion of said illumination optical system including said radiation source and said variable field aperture device, said main body supporting said projection optical system;
a stage that is provided as a separate unit from said main body and that holds and moves said object;
a base that supports said main body, at least part of said base being located below said main body;
an actuator located between said main body and said base to actuate said main body; and
a loader that is provided as a separate unit from said main body and said stage, said loader loading at least one of the original plate and the object to said projection exposure apparatus.

11. A projection exposure apparatus according to claim 10, further comprising:

a positioning drive device that performs driving for positioning so as to keep an amount of relative positional deviation between said at least one portion of said illumination optical system and said main body within a predetermined value.

12. A projection exposure apparatus according to claim 10, further comprising:
an original plate stage that holds and moves the original plate; and
an interferometer that is connected to said main body to detect a position of the original plate stage.

13. A projection exposure apparatus according to claim 10, further comprising a drive frame that moves responsive to a reaction force exerted by the movement of said stage.

14. A projection exposure apparatus that illuminates an original plate on which a predetermined pattern is formed with light emitted from a light source to project an image of the pattern onto an object, comprising:
an illumination optical system that illuminates the original plate;
a main body that is provided as a separate unit from at least part of said illumination optical system, said main body comprising at least one of an original plate stage to hold the original plate and an object stage to hold the object;
a base that supports the main body, at least a part of the base being located below said main body;
an actuator located between the main body and the base to actuate said main body; and
a frame that is provided as a separate unit from said main body, the frame receiving a reaction force exerted by the movement of said at least one of the original plate stage and the object stage.

15. A projection exposure apparatus according to claim 14, wherein said original plate stage or said object stage is driven by a non contact type drive device having a movable element and a fixed element, and said movable element is provided to said original plate stage or said object stage while said fixed element is provided to said frame.

16. A projection exposure apparatus according to claim 14, further comprising an interferometer that is connected to said main body and detects a position of said original plate stage.

17. A projection exposure apparatus according to claim 14, further comprising an interferometer that is connected to said main body and detects a position of said object stage.

18. A projection exposure apparatus that illuminates an original plate on which a predetermined pattern is formed with light emitted from a light source to project an image of the pattern onto an object, comprising:
a main body that supports a projection optical system which is provided between the original plate and the object to project the image of the pattern onto the object;
an illumination optical system at least a part of which is provided as a separate unit from the light source and said main body to illuminate the original plate;
a first stage that holds and moves one of the original plate and the object;
a drive frame disposed outside of the first stage to move responsive to a reaction force exerted by the movement of the stage;
a base that supports said main body, at least part of said base being located below said main body;
an actuator located between said main body and said base to actuate said main body; and a loader that is provided as a separate unit from said main body and said illumination optical system, said loader loading at least one of the original plate and the object to said projection exposure apparatus.

19. A projection exposure apparatus according to claim 18, further comprising:

a second stage that holds and moves the other of the original plate and the object.

20. A projection exposure apparatus according to claim 19, wherein at least one of said first stage and said second stage is movably held by the main body.

21. A projection exposure apparatus according to claim 19, further comprising:

an interferometer that is connected to said main body to detect a position of the first stage.

22. A projection exposure apparatus according to claim 18, wherein the first stage holds the object.

23. A projection exposure apparatus according to claim 18, wherein said light source is an excimer laser light source.

* * * * *